United States Patent
Angelopoulos et al.

(10) Patent No.: US 6,979,518 B2
(45) Date of Patent: *Dec. 27, 2005

(54) ATTENUATED EMBEDDED PHASE SHIFT PHOTOMASK BLANKS

(75) Inventors: Marie Angelopoulos, Cortlandt Manor, NY (US); Katherina Babich, Chappaqua, NY (US); S. Jay Chey, Ossining, NY (US); Michael Straight Hibbs, Westford, VT (US); Robert N. Lang, Pleasant Valley, NY (US); Arpan Pravin Mahorowala, Bronxville, NY (US); Kenneth Christopher Racette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/727,925

(22) Filed: Dec. 4, 2003

(65) Prior Publication Data

US 2004/0170907 A1 Sep. 2, 2004

Related U.S. Application Data

(63) Continuation of application No. 10/303,341, filed on Nov. 22, 2002, now Pat. No. 6,730,445, which is a continuation-in-part of application No. 10/122,876, filed on Apr. 12, 2002, now Pat. No. 6,682,860.

(51) Int. Cl.$^7$ .................................................. G03F 9/00
(52) U.S. Cl. ...................................................... 430/5
(58) Field of Search ......................... 430/5, 322–324; 204/192.1, 192.11, 192.12, 162.1

(56) References Cited

U.S. PATENT DOCUMENTS

| 6,309,780 B1 | 10/2001 | Smith ............................. 430/5 |
| 6,395,433 B1 | 5/2002 | Smith ............................. 430/5 |

OTHER PUBLICATIONS

Burn, J. Lin, "The Attenuated Phase–Shifting Mask", Solid State Technology, Jan. 1992, pp. 43–47.

Liberman, V. et al., "Materials Issues For Optical Components And Photomasks In 157 NM Lithography", J. Vac. Sci. Technol. B17, Nov./Dec. 1999, pp. 3273–3279.

*Primary Examiner*—S. Rosasco
(74) *Attorney, Agent, or Firm*—Scully, Scott, Murphy & Presser; Daniel P. Morris, Esq.

(57) ABSTRACT

An attenuating embedded phase shift photomask blank that produces a phase shift of the transmitted light is formed with an optically translucent film made of metal, silicon, nitrogen and oxygen. An etch stop layer is added to improve the etch selectivity of the phase shifting layer. A wide range of optical transmission (0.001% up to 15% at 157 nm) is obtained by this process.

21 Claims, 11 Drawing Sheets

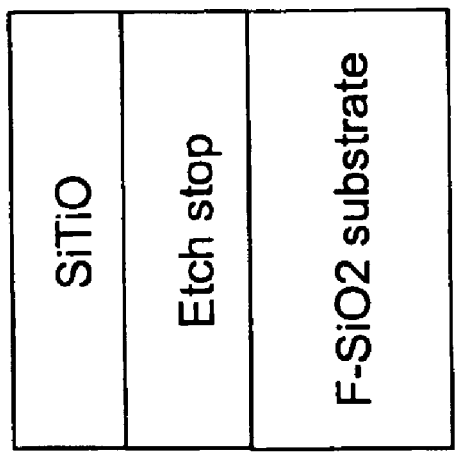
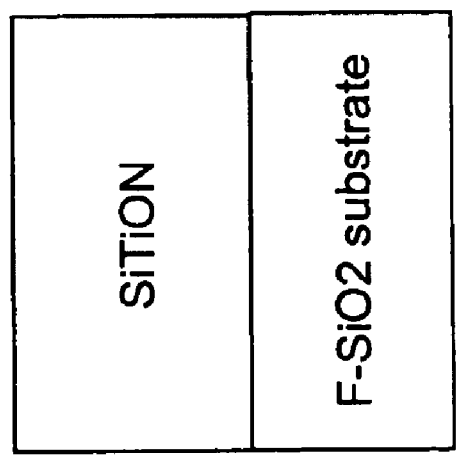
Fig. 1

| ID | Si | Ti | O | N | n | k | thickness | T% |
|---|---|---|---|---|---|---|---|---|
| #1 | 29.9 | 4.3 | 66.9 | 0 | 1.67 | 0.175 | 1175 A | 18.2 |
| #2 | 33.5 | 3.0 | 43.7 | 19.2 | 2.04 | 0.307 | 765 A | 13.6 |
| #3 | 34.2 | 4.0 | 36.1 | 24.4 | 2.10 | 0.467 | 725 A | 5.9 |
| #4 | 35.2 | 4.5 | 32.7 | 27.3 | 2.08 | 0.530 | 740 A | 3.8 |
| #5 | 39.1 | 4.3 | 16.3 | 40.3 | 2.08 | 0.591 | 743 A | 2.6 |
| #6 | 41.6 | 3.3 | 1 | 54.1 | 2.39 | 1.025 | 590 A | 0.0 |

Fig. 3

| | thickness | n | k | T% |
|---|---|---|---|---|
| SiTiO (phase shifter layer) | 1150 Å | 1.673 | 0.175 | |
| Ti (etch stop layer) | 149 Å | 1.121 | 1.230 | 5.9 |
| SiTiO (phase shifter layer) | 1170 Å | 1.673 | 0.175 | |
| Ta (etch stop layer) | 106 Å | 1.251 | 1.667 | 5.9 |

Fig. 5

| Materials | Etch Selectivity | Etch gas |
|---|---|---|
| SiTiO/Ti | 13 | CHF3/CH2F2/Ar |
| SiTiO/Ta | 12 | CHF3/CH2F2/Ar |
| Ti/quartz | 25 | Cl2 |
| Ta/quartz | 4.7 | Cl2 |
| SiTiON/quartz | 1.7 | CF4 |

Fig. 8

ATTENUATED EMBEDDED PHASE SHIFT PHOTOMASK BLANKS

This application is a continuation application of U.S. application Ser. No. 10/303,341, filed Nov. 22, 2002, now U.S. Pat. No. 6,730,445, which is a CIP of application Ser. No. 10/122,876 filed on Apr. 12, 2002, now U.S. Pat. No. 6,682,860, the teaching of which is incorporated herein by reference.

CROSS REFERENCE TO A RELATED APPLICATION

Copending U.S. application Ser. No. 09/793,646 filed on 26 Feb. 2001 entitled "Attenuated Embedded Phase Shift Photomask Blanks, the teaching of which is incorporated herein by reference.

FIELD OF THE INVENTION

The present invention is directed to attenuated embedded phase shift photomask blanks and in particular to attenuated phase shift mask (APSM) materials and processes.

BACKGROUND OF INVENTION

Phase shift masks are gaining attention as the next generation lithographic technique for microelectronic fabrication due to their capability to produce higher resolution images compared to the conventional binary photomasks. Among the several phase shifting schemes, the attenuating embedded phase shifter proposed by Burn J. Lin, Solid State Technology, January issue, page 43 (1992), the teaching of which is incorporated herein by reference, is gaining wider acceptance because of its ease of fabrication and the associated cost savings. There have been a number of variations associated with this scheme to improve the optical properties of the photomask, i.e. tunability of the optical transmission and resistance against photon irradiation and chemical treatments. 157 nm lithography is being considered as a post 193 nm lithography scheme. Currently, there are no mature APSM materials for 157 nm that exhibit appropriate optical properties, tunability, radiation and chemical durability, etch selectivity, low defects, and ease of manufacturability. Previously in U.S. application Ser. No. 09/793,646 filed on 26 Feb. 2001, we disclosed an APSM Material and process based on SiTiN,SiTiON system for 193 nm lithography— the teachings of which are incorporated herein by reference.

Herein we describe compositions of matter and methods of fabricating 157 nm APSM materials in particular a stacked bi-layer structure and methods of fabricating a phase shift photomask that has tunable optical transmission, coupled with stable optical properties during usage (photon exposure and chemical treatments) of the photomask, and a superior etch selectivity. The composition consists of $SiM_xO_yN_z$ materials with an etch stop layer, where element M represents a metal as described in the claims.

SUMMARY OF THE INVENTION

A broad aspect of the present invention comprises an attenuating embedded phase shift photomask blank capable of producing a phase shift of 180° with an optical transmission of at least 0.001% at a selected lithographic wavelength, having chemical and optical durability and flexible optical transmission tunability.

In another aspect, the invention comprises a process of making an attenuating embedded phase shift photomask, which process comprises the steps of depositing a bi-layer of thin film phase shifting materials.

In another aspect, the invention comprises a phase shifting composition of matter consisting of a phase shifting layer and an etch stop.

BRIEF DESCRIPTION OF THE DRAWINGS

These and other objects, features and advantages of the present invention will become apparent upon a consideration of the following detailed description and the invention when read in conjunction with the drawing Figures, in which:

FIG. 1 shows two schematics of APSM. (a)single layer approach and (b) bi-layer approach.

FIG. 3 is a table of the atomic composition, optical constants n and k, thickness required to give 180 degree phase shift and the corresponding transmission at 157 nm. The atomic composition was measured by Xray photoelectron spectroscopy and Rutherford back scattering. The optical constants were measured with the VESA Woollam Ellipsometer. The thickness and transmission were calculated using the optical constants.

FIG. 5 shows the optical constants (n and k), thickness of the thin films and corresponding transmission at 157 nm. The optical constants are measured with the VESA Woollam ellipsometer and the thickness corresponding to 180 degree phase shift and transmission is calculated from the optical constants.

FIG. 8 is a table of the RIE etch selectivity of SiTiO, Ti, Ta and quartz with the corresponding etch gas.

DETAILED DESCRIPTION

Figure 2:
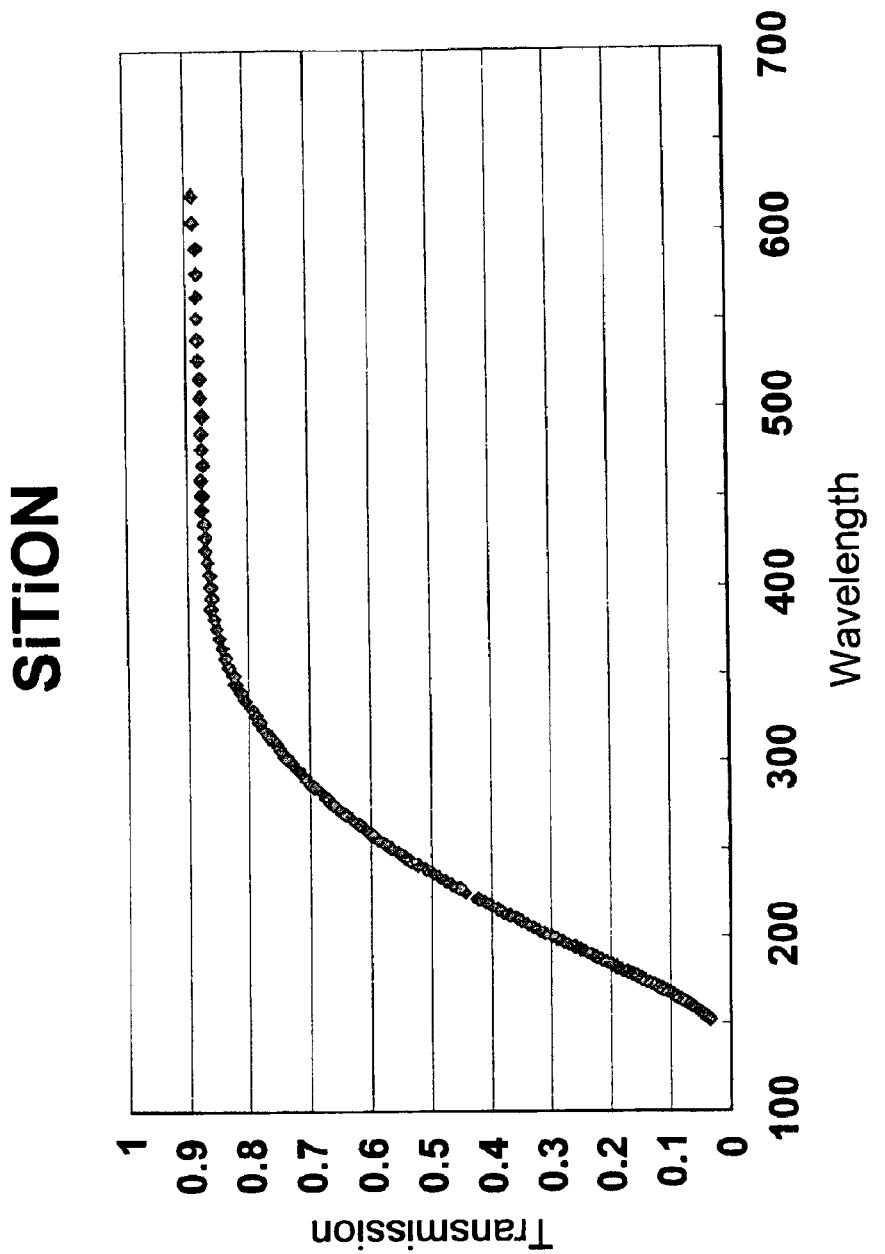
FIG. 2 is a Transmission curve as a function of wavelength for a single layer approach, in particular SiTiON.

A composition of matter and process is invented for fabricating photomask blanks that produces phase shifting films having tunable optical characteristics (% T, n and k) (T is the transmission; n is the index of refraction; and k is the extinction coefficient) with 180° phase shift at 157 nm and with good stability against laser irradiation and chemical treatment, as well as a good etch selectivity. The phase shifting films comprise of a bi-layer structure. The layer adjacent to the substrate controls the % T and also acts as an etch stop layer while the other layer on top acts as the phase shifting layer. The first layer comprises a metal or metal based film. An example will be given for titanium and tantalum. The phase shifting films comprise silicon and a metal and nitrogen and/or oxygen. The metal can be an element from the groups II, IV, V, transition metals, lanthanides and actinides. An example will be given for titanium as the metal. The invention comprises a phase shifting layer ($Si_wTi_xN_yO_z$, where w is in the range 0.1 to 0.6, x is in the range 0 to 0.2, y is in the range 0 to 0.6, z is in the range 0 to 0.7) on top of a etch stop layer (metal or metal based layer) which is deposited on a substrate (quartz, fluorinated quartz, $CaF_2$, or $Al_2O_3$, etc), the methods for forming the layers.

1. Deposition

The thin film can be deposited by sputter deposition (RF, DC magnetron, AC magnetron, pulsed bipolar DC magnetron, RF diode sputtering, or other sputter deposition methods familiar to those skilled in the art) from either a single target of a composite material (for example, $Si_{1-x}M_x$, with x in the range 0 to 0.5 and M representing an element from either groups II, IV, V, transition metals, lanthanides and actinides) or two or more targets of different compositions (for example, $SiO_2$ and M targets, or $Si_{1-x}M_x$ and M targets). Variation in composition of the composite targets or individual variation of power and deposition time of the pure targets produces changes in film composition. Reactive sputtering with nitrogen and oxygen provides further capability to adjust the relative compositions of Si, M, and N and O, and thus the optical characteristics of the film. The substrate stage can be either stationary or planetary for the single target, and planetary for the multitarget with rotation speed adjusted accordingly.

Specifically, a RF magnetron sputtering was used for a single target ($Si_{0.7}(TiSi_2)_{0.1}$) deposition for the phase shifting layer SiTiO (Ti as the element M) and a DC magnetron deposition was used for the etch stop layer (Ta and Ti) deposition. To obtain a thin film stable against chemical treatment used in photomask cleaning, the deposition condition needs to be optimized. We identified the preferred deposition conditions needed for chemical resistance.

2. Optical Properties

The optical properties (index of refraction (n), and extinction coefficient (k)) of both the phase shifting layer and etch stop layers were determined using a multi-angle ESA Woollam Ellipsometer in the range of 150 to 700 nm. Then, the preferred film thickness to obtain a 180 degree phase shift was calculated by using those optical constants. The transmission at 180° phase shift was measured in the transmission mode of the ellipsometer and compared with the calculated transmission value. The transmission change during the laser irradiation was monitored in real time by monitoring the laser intensity change as it irradiates onto the APSM sample. The laser measurement set up is similar to the one described by Liberman et al. (1999).

EXAMPLES (A) $Si_wTi_xN_yO_z$ Single Layer

1) Processing Gas $Ar/O_2/N_2$

Thin films composed of $Si_wTi_xN_yO_z$ by using a $Si_{0.7}(TiSi_2)_{0.1}$ target were deposited, with the substrate in a rotating holder with planetary motion or positioned under the target without planetary motion. Sputtering was carried out in an argon/nitrogen/oxygen mixture with 1.0 mT Ar partial pressure. Ultra high purity gases were used for Ar, $N_2$ and $O_2$ (99.999%) and the background pressure of the chamber was <9.0×10$^{-7}$ torr. The thin film was deposited by RF magnetron sputtering from a five inch diameter target with a power of 450 W. Under the above conditions, the deposition rate was typically 0.3 to 1.6 Å/sec.

Prior to sputtering, the target was presputtered in 5 mT Ar for 5 min at 450 W. Then 5 min of presputtering was performed under the deposition condition of the thin film to precondition the surface of the target. After presputtering, the substrates were preferably immediately loaded through a load lock chamber into the deposition chamber and deposition was carried out. The film thickness ranged between 400 to 2000 Å depending on the deposition conditions. FIG. 2 shows the optical transmission as a function of wavelength. The film has a refractive index k of 2.10 and the absorption constant k of 0.467. The corresponding film thickness of the film is 745 Å which gives a transmission of 5.26% at 157 nm. According to calculation, the film with the same optical constants requires a thickness of 711 Å to obtain a 180 degree phase shift at 157 nm resulting in a transmission of 5.9%. By adjusting the oxygen to nitrogen, transmission as high as 18% can be achieved at 157 nm. FIG. 3 is a table of the atomic composition of the films with varying concentration of oxygen as measured by Xray photoelectron spectroscopy and Rutherford Back Scattering. The optical constants n and k are measured with the VESA Woollam ellipsometer and the optical transmission at 157 nm for a film thickness corresponding to 180 degree phase shift is calculated. As the oxygen concentration increases, the refractive index n decreases. As a result, the thickness required for 180 phase shift increases as well as the optical transmission at 157 nm.

While this single layer APSM satisfies the optical properties, the etch selectivity against quartz was poor, with etch selectivity of less than 1.7 under $CF_4$ plasma. This is due to the fact that a fairly high oxygen concentration (>35%) is required to give a suitable transmission and this high oxygen concentration results in less selectivity versus the quartz substrate. As an effort to improve the etch selectivity, a bi-layer APSM which utilizes an etch stop is developed.

(B) $Si_wTi_xO_z$/Metal Bi-Layer

For the bi-layer APSM, a metal etch stop layer is deposited on the fluorinated quartz substrate. (FIG. 1) Here we show examples with Titanium etch stop and Tantalum etch stop. After the metal etch stop layer, a phase shifting layer, composed of $Si_wTi_xN_yO_z$ by using a $Si_{0.7}(TiSi_2)_{0.1}$ target is deposited. The example given here utilizes the composition with maximum transparency (y=0) for a given ratio of Si to Ti.

Sputtering for the metal layer is carried out in argon processing gas with 1.0 mT Ar partial pressure, with DC magnetron sputtering. Prior to the actual film deposition, the target was pre-sputtered for 10 min while the substrate was isolated in the load lock chamber. The thin film is deposited from a five inch diameter target with power ranging from 150 to 300 W. Under the above conditions, the deposition rate was typically 2.3 to 4.5 Å/sec. Typically, the etch stop layer thickness ranges from 10 Å to 400 Å. After the metal etch stop layer deposition, the substrate is transferred to the load lock chamber while the pre-sputter cleaning for the phase shifting layer takes place. The phase shifting layer is deposited by RF sputter deposition from a five inch diameter target. For this example, a SiTiO film is deposited under argon/oxygen mixture processing gas with 1.0 mT Ar partial pressure (Ar flow at 15 sccm). Oxygen is leaked in with a Gransville-Phillips precision leak valve to maintain a constant $O_2$ partial pressure ranging from 0.10 to 0.70 mT. The RF power ranges from 450 W to 900 W. Under the above conditions, the deposition rate is typically 0.75 to 1.7 Å/sec. The phase shifting layer thickness ranges between 400 to 2000 Å depending on the deposition conditions.

The best optical and chemical durability was achieved with the following conditions for the phase shifting layer SiTiO. The RF power is set to 900 W, the Ar partial pressure 1.0 mT and Oxygen partial pressure 0.55 mT. For films with oxygen partial pressure less than 0.35 mT, the optical transmission was too low for practical usage due to the low incorporation of the oxygen in the film. Also, the low power depositions (450 W) gave inferior chemical durability, likely as a result of higher porosity (less density) of the film. Prior to loading the substrates, the substrates are pre-cleaned with an oxygen asher to eliminate hydrocarbons that can reduce the transmission at 157 nm.

Figure 4:
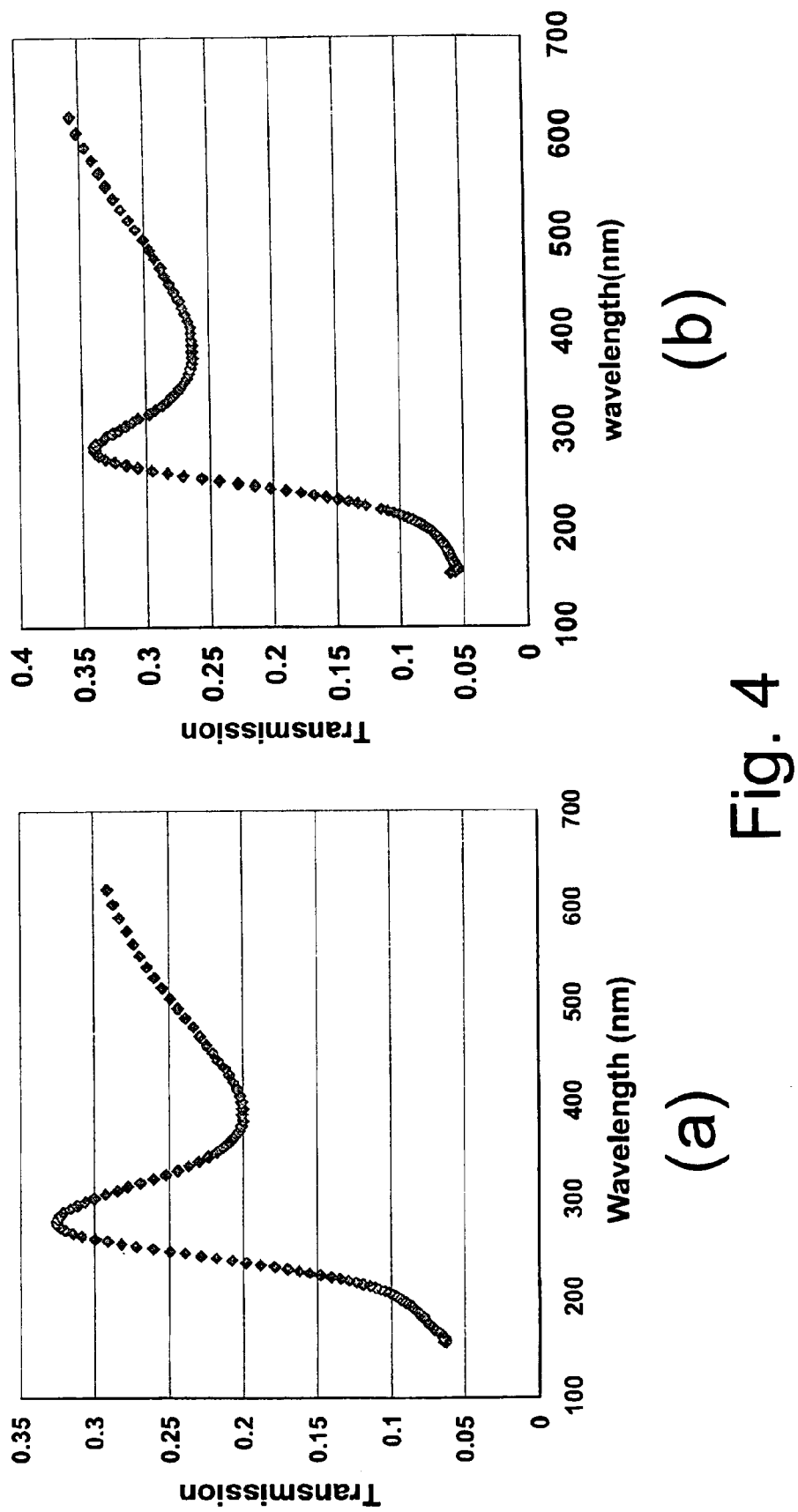
FIG. 4 show Transmission curves as a function of wavelength for a bi-layer APSM. (a) The top layer is the phase shifting layer SiTiO and the bottom layer is the etch stop layer Ti. (b) The top layer is the phase shifting layer SiTiO and the bottom layer is the etch stop layer Ta.

FIG. 4 is the transmission curve as a function of wavelength for SiTiO/Ti and SiTiO/Ta. The transmission at the inspection wavelength 248 nm are less than 30% for both APSM. This is another advantage over the single layer APSM. The atomic composition of the phase shifting layer SiTiO is shown in the table of FIG. 3. The optical constants (n and k) and the film thicknesses were measured by the Woollam ellipsometer. The values are shown in FIG. 5 together with the corresponding transmission at 157 nm. The advantage of a bi-layer scheme is that the optical transmission is easier to adjust compared to the single layer. Instead of changing the concentration of the oxygen, simply by adjusting the etch stop layer the transmission can be adjusted. For example, SiTiO of 1150 Å with Ti of 149 Å will give a 180 degree phase shift with transmission of 5.9%. By reducing the Ti to 60 Å (and SiTiO to 1175 Å) the transmission becomes 12%. Similarly, for SiTiO of 1170 Å with Ta of 106 Å will give a 180 degree phase shift with transmission of 5.9%. By reducing the Ta to 50 Å (and SiTiO to 1183 Å) the transmission becomes 10.6%.

Figure 6:
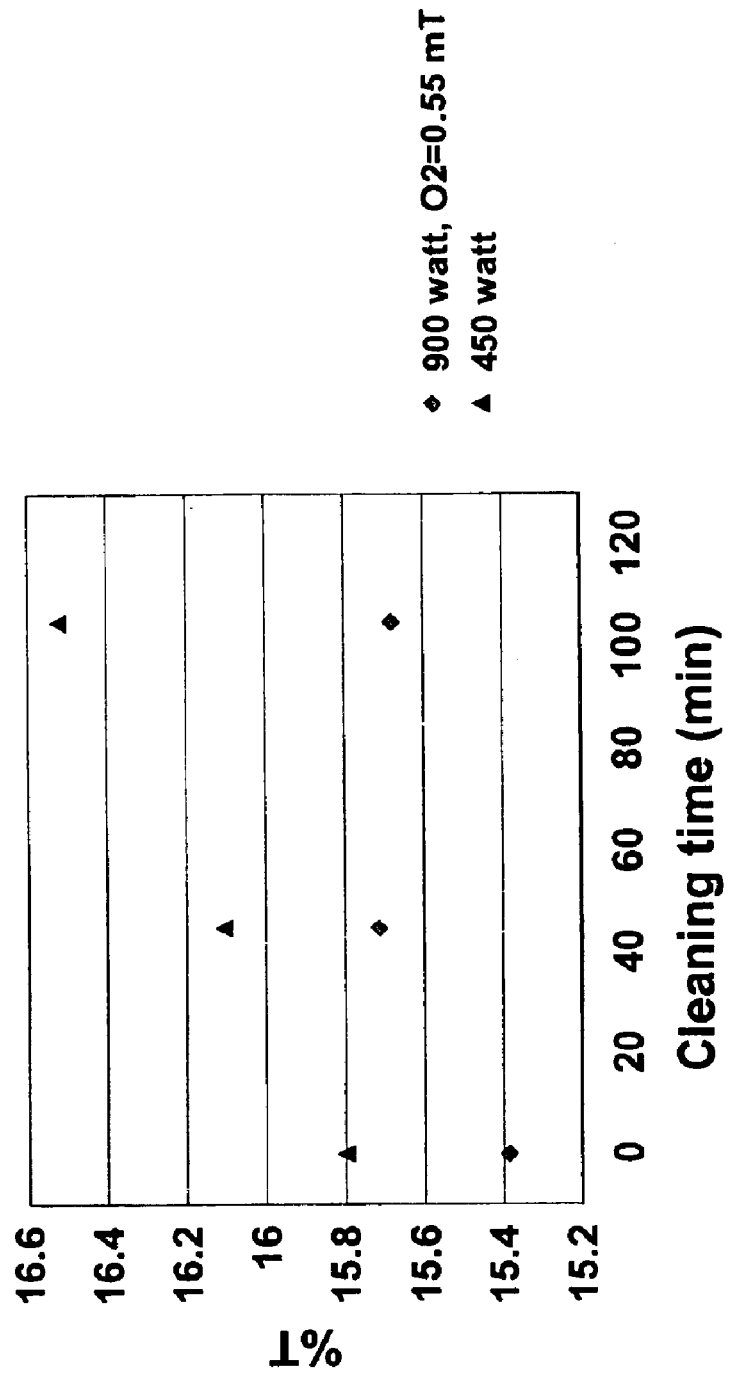
FIG. 6 is a graph of the Transmission versus the cleaning time for the phase shifting layer SiTiO in a mixture of hot sulfuric acid and hydrogen peroxide solution at 90 C ($H_2SO_4:H_2O_2=3:1$).
Figure 7:
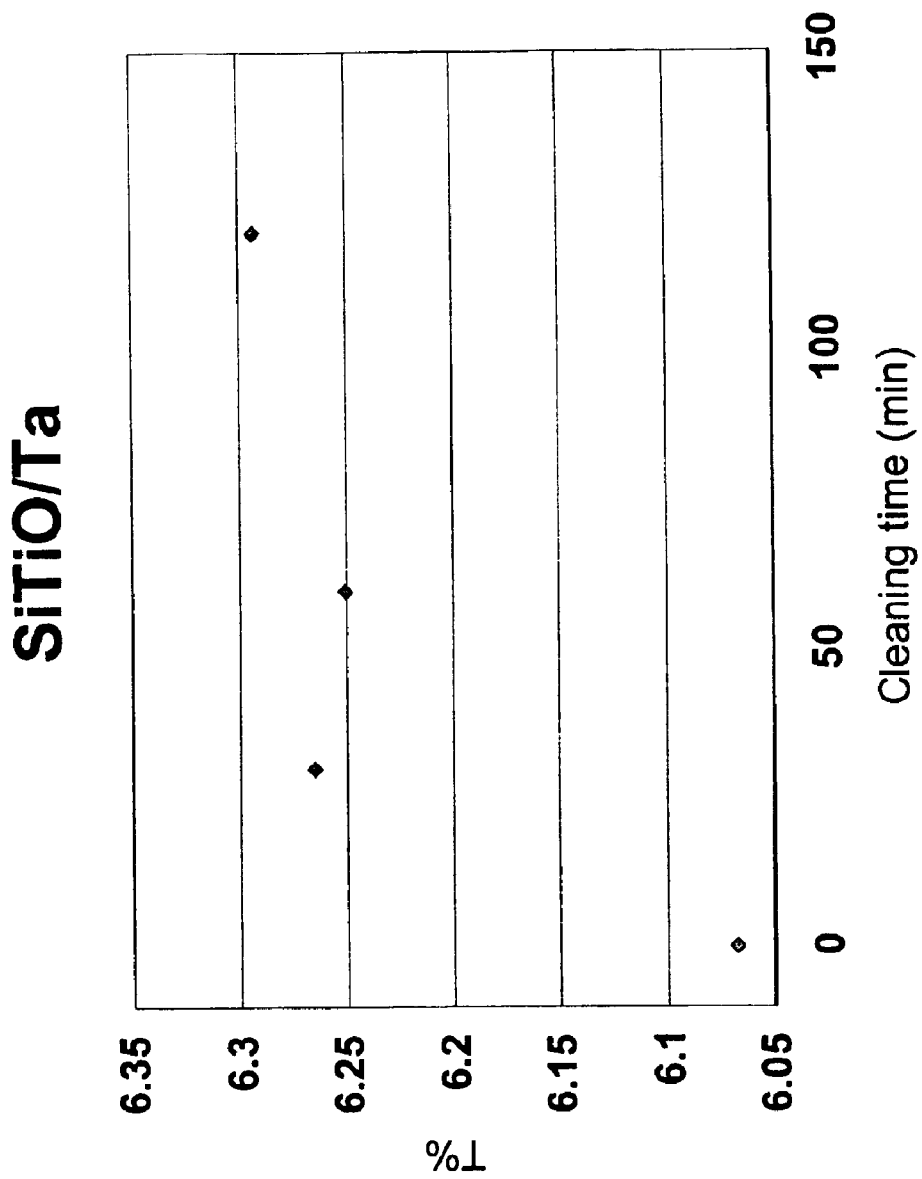
FIG. 7 is a graph of the Transmission versus the cleaning time for the bi-layer SiTiO/Ta in a mixture of hot sulfuric acid and hydrogen peroxide solution at 90 C ($H_2SO_4:H_2O_2=3:1$).

FIG. 6 summarizes the change of % T of the phase shifting layer SiTiO at 157 nm as a function of immersion time in a cleaning solution of sulfuric acid and hydrogen peroxide ($H_2SO_4$:$H_2O_2$=3:1, 90° C.), this solution is typically used for stripping photoresists in manufacturing line, also known as piranha solution. The total change of % T is 0.3% over 115 min of immersion. This excellent stability ensures a compatibility of the material with the standard photomask manufacturing process. For comparison, the deposition with lower power (450 W) is shown together. The chemical durability of the bi-layer SiTiO/Ta also shows extremely stable % T as a function of piranha cleaning. FIG. 7 summarizes the change of % T of the bi-layer SiTiO/Ta at 157 nm as a function of immersion time in a cleaning solution of sulfuric acid and hydrogen peroxide. An increase of the T %, from 6.07% to 6.27%, occurs after the initial clean, however, the subsequent cleaning over a period of 90 min gave a T % of 0.02%. This demonstrates that the bi-layer SiTiO/Ta has an excellent chemical stability against repeated cleanings.

FIG. 8 is a summary of the etch selectivity of the single layer scheme and the bi-layer scheme. The SiTiO/Ti and SiTiO/Ta are comparable, both a major improvement over the single layer scheme. However, the Ti/quartz shows a better etch selectivity over the Ta/quartz combination under identical etch conditions.

Figure 9:
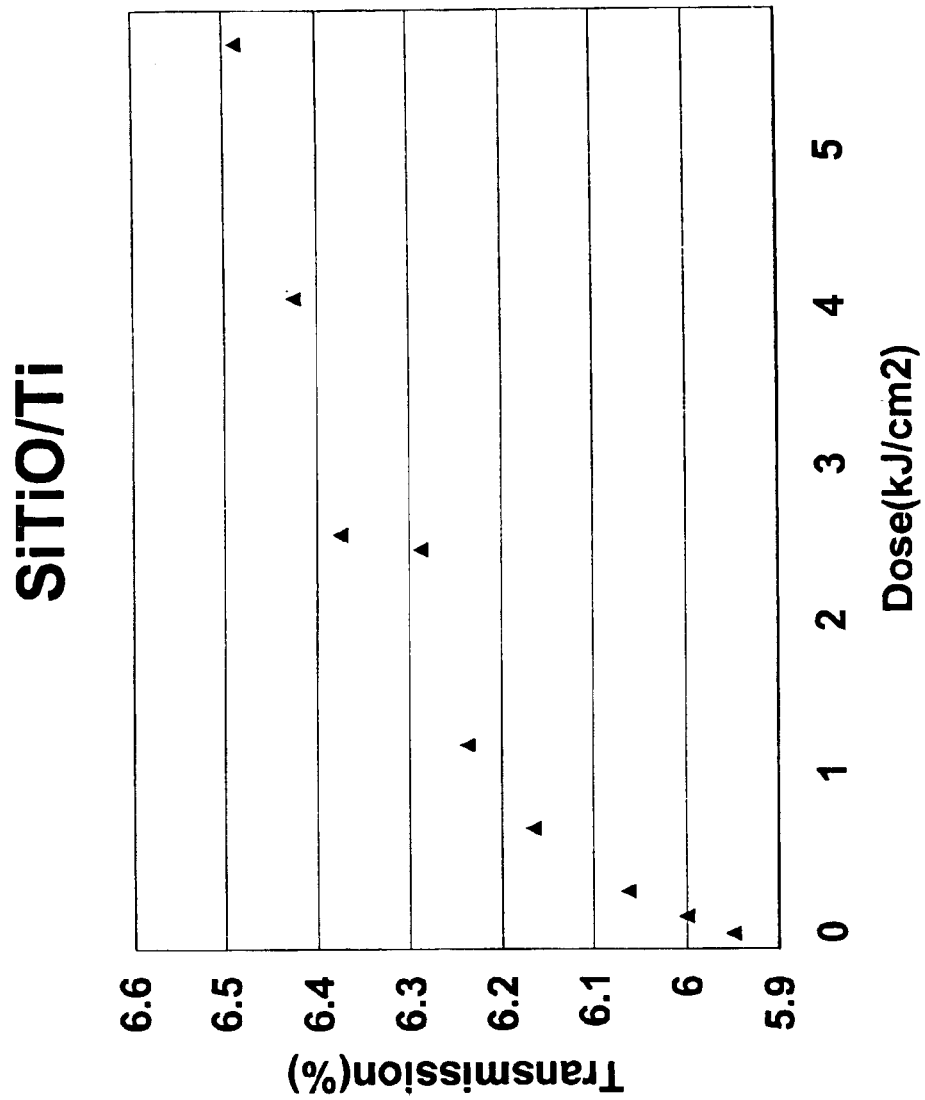
FIG. 9 is a graph of the laser durability of the APSM SiTiO on Ti. The Transmission change is plotted as a function of laser dose. The fluence of the 157 nm laser beam is 2.5 $mJ/cm^2$/pulse and the repetition rate is 50 Hz. The total laser dose is 5 $kJ/cm^2$.
Figure 10:
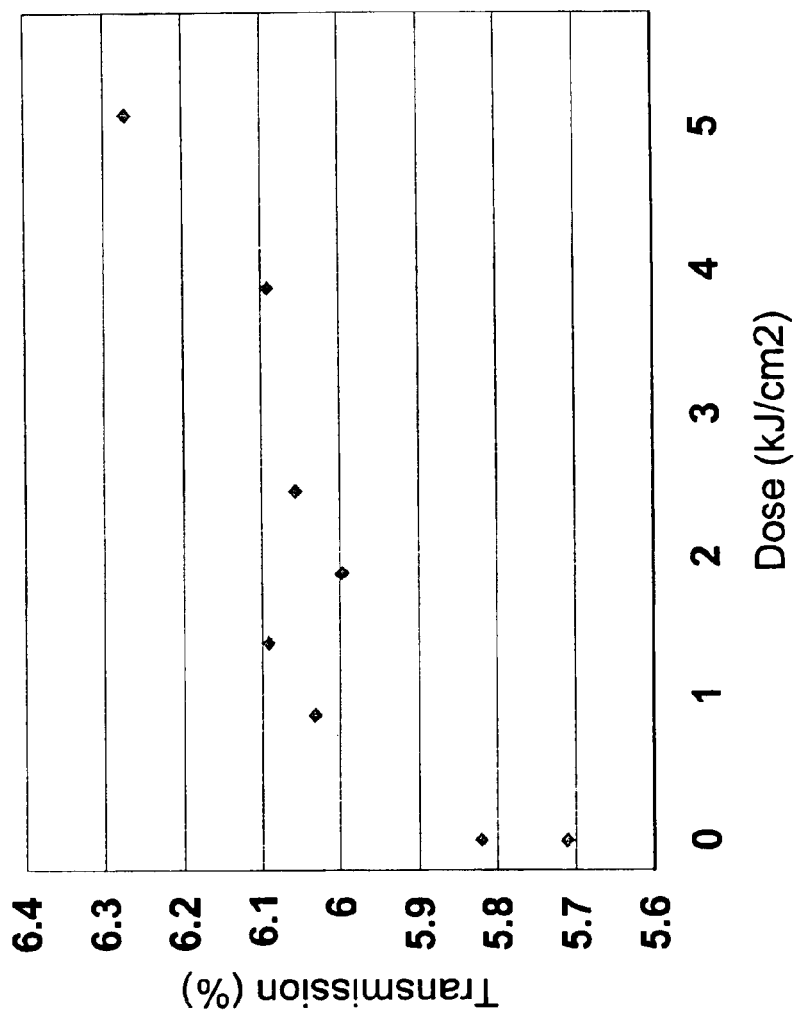
FIG. 10 is a graph of the laser durability of the APSM SiTiO on Ta. The Transmission change is plotted as a function of laser dose. The fluence of the 157 nm laser beam is 2.5 $mJ/cm^2$/pulse and the repetition rate is 50 Hz. The total laser dose is 5 $kJ/cm^2$.
Figure 11:
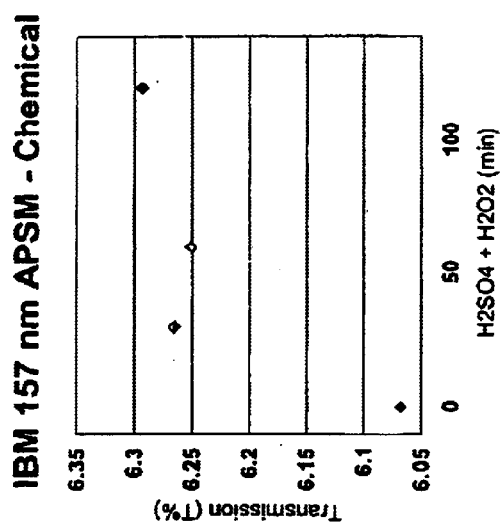
FIG. 11 illustrates a comparison of two graphs, a first graph depicting the transmission versus the cleaning time for the bi-layer SiTiO/Ta in a mixture of hot sulfuric acid and hydrogen peroxide solution, and a second graph depicting the transmission change plotted as a function of laser dose to illustrate durability of the APSM SiTiO on Ta.

Both SiTiO/Ta and SiTiO/Ti bi-layers showed excellent stabilities against 157 nm laser irradiation. FIG. 9 summarizes the change of % T for the SiTiO/Ti APSM at 157 nm as a function of irradiation at 157 nm (using a Lambda Physik LPX 120 F2 laser). The film was irradiated with laser power density of 2.5 mJ/cm$^2$/pulse at 50 Hz frequency. The total transmission change at a dose of 5.0 kJ/cm$^2$ is 0.50%. The sample was irradiated in a nitrogen atmosphere with less than 2 ppm oxygen. The SiTiO/Ti APSM gives a total increase of 0.5%. (5.94% to 6.44%). Also, the SiTiO/Ta bi-layer test is comparable to the SiTiO/Ti bi-layer. FIG. 10 summarizes the change of % T for the SiTiO/Ta at 157 nm as a function of irradiation at 157 nm (using a Lambda Physik LPX 120 laser). The film was irradiated with laser power density of 2.5 mJ/cm$^2$/pulse at 50 Hz frequency. The total transmission change at a dose of 5.0 kJ/cm$^2$ is 0.55%. The sample was irradiated in a nitrogen atmosphere with less than 2 ppm oxygen. The SiTiO/Ta APSM gives a total increase of 0.55% (5.71% to 6.26%).

While this invention has been described in terms of certain embodiment thereof, it is not intended that it be limited to the above description, but rather only to the extent set forth in the following claims. The embodiments of the invention in which an exclusive property or privilege is claimed are defined in the appended claims. The teaching of all references cited herein, are incorporated herein by reference.

What is claimed is:

1. An attenuating phase shift mask blank for use in lithography comprising:
    a substrate comprising a quartz or fluorinated quartz material;
    an etch stop layer deposited on said substrate comprising a metal selected from groups II, IV, V, transition metals, lanthanides and actinides, said etch stop layer exhibiting improved etch selectivity;
    a phase shifting layer disposed on said etch stop layer, the phase shifting layer comprising a composite material of formula $A_wB_xN_yO_z$, where A is an element selected from the group consisting of Groups IVA, VA, or VIA; and B is selected from the group consisting of an element from Groups II, IV, V, the transition metals, the lanthanides and the actinides;
    wherein w is from about 0.1 to about 0.6, x is from about 0 to about 0.2, y is from about 0 to about 0.6, and z is from about 0 to about 0.7; and
    said phase shift mask blank being capable of producing a photomask with substantially 180° phase shift and an optical transmission of at least 0.001% at a selected wavelength of <500 nm.

2. An attenuated phase shift mask blank according to claim 1, wherein the phase shifting layer comprises a silicon/titanium/nitrogen/oxygen composite.

3. An attenuating phase shift mask blank according to claim 2, wherein said silicon/titanium/nitrogen/oxygen composite has structural formula $Si_wTi_xN_yO_z$ wherein w is about 0.1 to about 0.6, x is from about 0 to about 0.2, y is from about 0 to about 0.6, and z is from about 0 to about 0.7.

4. An attenuating phase shift mask blank according to claim 1, wherein the phase shifting layer has a thickness of from about 400 Å to about 2000 Å.

5. An attenuated phase shift mask blank according to claim 1, wherein the etch stop layer comprises a composite material where the composite material comprises a material selected from the group consisting of a metal, an element from Groups II, IV, and V, Nitrogen and Oxygen.

6. An attenuated phase shift mask blank according to claim 5, wherein the etch stop layer comprises a material selected from the group consisting of titanium and tantalum.

7. An attenuating phase shift mask blank according to claim 5, wherein the etch stop layer has a thickness of from about 50 A to about 500 A.

8. An attenuating phase shift mask blank according to claim 1, wherein the phase shifting layer is SiTiO and the etch stop layer is Ta.

9. An attenuating phase shift mask blank according to claim 1, wherein the phase shifting layer is SiTiO and the etch stop layer is Ti.

10. A method according to claim 1, wherein the substrate is annealed at elevated temperature in an atmosphere selected from the group consisting of air, oxygen, a vacuum and a mixture of gases selected from the group consisting of $O_2$, $N_2$, $H_2$, Ar, Kr, Ne, He, $O_3$ and $H_2O$.

11. An attenuating phase shift mask blank according to claim 1, wherein said etch selectivity is greater than 10:1 with substrates of quartz or fluorinated quartz and at the same time have stable optical transmission against chemical cleaning and photon irradiation.

12. A method of fabricating an attenuating phase shift mask blank for use in lithography comprising:

providing a substrate comprising a quartz or fluorinated quartz material;

disposing a thin layer of etch stop layer on said substrate comprising a metal selected from groups II, IV, V, transition metals, lanthanides and actinides, said etch stop layer exhibiting improved etch selectivity;

disposing a layer of phase shifter layer on said etch stop layer, the phase shifting layer comprising a composite material of formula $A_wB_xN_yO_z$, where A is an element selected from the group consisting of Groups IVA, VA, or VIA; and B is selected from the group consisting of an element from Groups II, IV, V, the transition metals, the lanthanides and the actinides; wherein w is from about 0.1 to about 0.6, x is from about 0 to about 0.2, y is from about 0 to about 0.6, and z is from about 0 to about 0.7;

said blank is capable of producing a photomask with 180° phase shift and an optical transmission of at least 0.001% at a selected wavelength of <500 nm.

13. A method according to claim 12, wherein the phase shifting layer comprises a material selected from the group consisting of a silicon/titanium/nitrogen composite and a silicon/titanium/nitrogen/oxygen composite.

14. A method according to claim 13, wherein said silicon/titanium/nitrogen/oxygen composite has structural formula $Si_wTi_xN_yO_z$ wherein w is from about 0.1 to about 0.6, x from about 0 to about 0.2, y is from about 0 to about 0.6, and z is from about 0 to about 0.7.

15. A method according to claim 12, wherein the phase shifting film is formed by sputter deposition from two or more targets of different compositions using a technique selected from the group consisting of RF matching network, DC magnetron, AC magnetron, pulsed bipolar DC magnetron and RF diode.

16. A method according to claim 15, wherein the phase shifting layer is formed by sputter deposition from a target of a composite material $(Si_{1-x}Ti_x)$ wherein x is from about 0 to about 0.5 by a method selected from the group consisting of RF matching network, DC magnetron, AC magnetron, pulsed bipolar DC magnetron, Ion beam assisted deposition, Ion beam sputter deposition and RF diode.

17. A method to claim 15, wherein the substrate is disposed in a holder which can be either planetary or stationary and/or rotating or non-rotating.

18. A method according to claim 12, wherein the phase shifting film is formed by sputter deposition from two or more targets of different compositions using a technique selected from the group consisting of RF matching network, DC magnetron, AC magnetron, pulsed bipolar DC magnetron, Ion beam assisted deposition, Ion beam sputter deposition and RF diode.

19. A method according to claim 18, wherein said two or more targets are selected from the group consisting of $SiO_2$ targets and Ti targets, or $(Si_{1-x}Ti_x)$ targets wherein x is from about 0 to about 0.5 and Ti targets.

20. A method according to claim 18, wherein the substrate is disposed in a holder which can be either planetary or stationary and/or rotating or non-rotating.

21. A method according to claim 12, wherein said etch selectivity is greater than 10:1 with substrates of quartz or fluorinated quartz and at the same time have stable optical transmission against chemical cleaning and photon irradiation.

* * * * *